United States Patent [19]
Malhi

[11] Patent Number: 4,651,184
[45] Date of Patent: Mar. 17, 1987

[54] DRAM CELL AND ARRAY

[75] Inventor: Satwinder S. Malhi, Garland, Tex.

[73] Assignee: Texas Instruments Incorporated, Dallas, Tex.

[21] Appl. No.: 646,556

[22] Filed: Aug. 31, 1984

[51] Int. Cl.[4] .................. H01L 29/78; H01L 27/02; H01L 29/34; H01L 29/04

[52] U.S. Cl. .................. 357/23.6; 357/23.4; 357/41; 357/54; 357/59

[58] Field of Search .................. 357/23.6, 23.4, 41, 357/59

[56] References Cited

U.S. PATENT DOCUMENTS

| 4,199,772 | 4/1980 | Natori et al. | 357/55 |
| 4,353,086 | 10/1982 | Jaccodine et al. | 357/23.6 |
| 4,462,040 | 7/1984 | Ho et al. | 357/23.6 |

FOREIGN PATENT DOCUMENTS

| 48405 | 5/1984 | European Pat. Off. | 357/23.6 |
| 59-19366 | 1/1984 | Japan | 357/23.6 |

OTHER PUBLICATIONS

Chang, T. S. and D. L. Critchlow, "Vertical FET Random-Access Memories with Deep Trench Isolation" IBM Technical Disclosure Bulletin, vol. 22, No. 8B Jan. 1980.

Primary Examiner—Andrew J. James
Assistant Examiner—R. P. Limanek
Attorney, Agent, or Firm—Carlton H. Hoel; Douglas A. Sorensen; Melvin Sharp

[57] ABSTRACT

A dRAM cell and array of cells, together with a method of fabrication, are disclosed wherein the cell includes one field effect transistor and one capacitor with both the transistor and the capacitor formed in a trench in a substrate. One capacitor plate and the transistor source are common and are formed in the lower portion of the trench sidewall. The transistor drain is formed in the upper portion of the trench sidewall to connect to a bit line on the substrate surface, and the channel is the vertical portion of the trench sidewall between the source and drain. A ground line runs past the transistor gate in the upper portion of the trench down into the lower portion of the trench to form the other capacitor plate.

10 Claims, 12 Drawing Figures

DRAM CELL AND ARRAY

BACKGROUND

The present invention relates to semiconductor devices, and, more particularly, to dynamic random access memories.

The development of large monolithic dynamic random access memories (dRAMs) has run into many problems, and one of the most important of these problems is that of shrinking the dRAM cell size without increasing the soft-error rate in order to pack more cells on a chip. Large dRAMs are silicon based and each cell typically includes a single MOS field effect transistor with its source connected to a storage capacitor, its drain connected to a bit line, and its gate connected to a word line; the cell operates by storing a charge on the capacitor for a logic 1 and not storing any charge for a logic 0. Traditionally the cell capacitor has been formed by an inversion layer separated from an overlying electrode by a thin oxide layer and from the substrate by a depletion layer. However, to maintain stable circuit operation the capacitance must be large enough to yield a sufficient signal to noise ratio, and this leads to large substrate area devoted to the capacitor. Further, such a MOS capacitor is vulnerable to charges generated in the substrate by alpha particles (a 5 MeV alpha particle can produce more than 200 femtocoulombs of hazardous electrons), noise injected from the substrate, pn junction leakage over the entire area of the capacitor, and subthreshold leakage of the cell transistor. A typical stored charge in a dRAM cell is 250 fC. For a three volt power supply this requires a storage capacitor of 50 fF; and with a storage oxide thickness of 150 Å, a capacitor area of about 20 square microns is needed. This imposes a lower limit on the cell size if conventional two dimensional technology is used.

One approach to solve these problems appears in Jolly et al, A Dynamic RAM Cell in Recrystallized Polysilicon, 4 IEEE Elec. Dev. Lett. 8 (1983) and forms all basic elements of the cell, including both the access transistor and the charge storage capacitor, in a layer of beam recrystallized polysilicon deposited on an oxide layer on a silicon substrate. The bit line is contained in the recrystallized polysilicon layer, and turning on the transistor causes charge to flow into the storage region, which is composed of heavily doped, recrystallized polysilicon surrounded on the top, bottom, and three sides by thermally grown oxide. The storage capability is about twice that of a conventional capacitor of the same storage area since electrodes both above and below are separated from the storage region in the recrystallized polysilicon by thin oxides. In addition, the lower oxide isolates the storage region from any charge injected into the substrate either from surrounding circuitry or by alpha particles or other radiation generating soft errors. Further, thick oxide under the bit line and complete sidewall oxide isolation reduce the bit-line capacitance. However, even doubling the capacitance over the traditional design fails to sufficiently shrink the area occupied by the cell capacitor.

Another approach to shrink the area occupied by the cell capacitor is to form the capacitor in a trench. For example, E. Arai, Submicron MOS VLSI Process Technologies, IEEE IEDM Tech Digest 19 (1983); K. Minegishi et al, A Submicron CMOS Megabit Dynamic RAM Technology Using Doped Face Trench Capacitor Cell, IEEE IEDM Tech Digest 319 (1983); and T. Morie et al, Depletion Trench Capacitor Technology for Megabit Level MOS dRAM, 4 IEEE Elec. Dev. Lett. 411 (1983) all describe a cell with a traditional design except for the capacitor which has been changed from plates parallel to the substrate to plates on the walls of a trench in the substrate. Such a trench capacitor permits large capacitance per area of substrate by simply using a deep trench. The capacitors described in these articles were fabricated as follows: Starting with (100) oriented, p-type, 4–5 ohm-cm resistivity silicon substrates, trench pattern with 0.4–1.0 micron width were formed by electron-beam direct writing. Trenches of 1–3 micron depth were then excavated by reactive ion etching with $CBrF_3$ at a pressure of about 14 mTorr; the trench surfaces were cleared of RIE damage by an etch in a mixture of nitric, acetic, and hydrofluoric acids. PSG was then deposited by CVD using a $PH_3/SiH_4/O_2$ gas system, the phosphorous diffused into the trench surface layers, and the PSG etched away by hydofluoric acid. $SiO_2$ of 150–500 Å was grown in dry $O_2$ or CVD $Si_3N_4$ was deposited 500 Å thick on the trench walls. Lastly, the trenches were filled with LPCVD polysilicon. The capacitance per unit area of trench sidewall was comparable to the capacitance per unit area of a traditional capacitor; consequently, deep trench capacitors can shrink cell substrate area by enhancing the storage capacitor area per unit substrate area.

A third approach to shrinking dRAM cell size is similar to the second approach described in the preceding paragraph and relies on a capacitor with plates extending into the substrate. This capacitor, called a corrugated capacitor, is described in H. Sunami et al, A Corrugated Capacitor Cell (CCC) for Megabit Dynamic MOS Memories, IEEE IEDM Tech Digest 806 (1982); H. Sunami et al, A Corrugated Capacitor Cell (CCC) for Megabit Dynamic MOS Memories, 4 IEEE Elec. Dev. Lett. 90 (1983); and K. Itoh et al, An Experimental 1Mb DRAM with On-Chip Voltage Limiter, 1984 IEEE ISSCC Digest of Tech Papers 282. The corrugated capacitor extends about 2.5 microns into the silicon substrate. Fabrication proceeds as follows: Trenches are formed by ordinary reactive sputter etching with $CCl_4$ gas using a CVD silicon dioxide film mask; a wet etch cleans up any dry etching damage and contaminations. After trench formation, a triple storage layer of silicon dioxide/silicon nitride/silicon dioxide is formed on the trench walls. Lastly, the trench is filled with LPCVD polysilicon. Use of the corrugated capacitor assertedly yields more than seven times the capacitance of the conventional cell, with a three microns by seven micron cell having a 60 fF storage capacitance.

The use of trenches for isolation is also well known and has been extensively studied; for example, R. Rung et al, Deep Trench Isolated CMOS Devices, IEEE IEDM Tech Digest 237 (1982); K. Cham et al, A Study of the Trench Inversion Problem in the Trench CMOS Technology, 4 IEEE Elec. Dev. Lett. 303 (1983); A. Hayasaka et al, U-Groove Isolation Technique for High Speed Bipolar VLSI's, IEEE IEDM Tech Digest 62 (1982); H. Goto et al, An Isolation Technology for High Performance Bipolar Memories—IOP-II, IEEE IEDM Tech Digest 58 (1982); T. Yamaguchi et al, High-Speed Latchup-Free 0.5-um-Channel CMOS Using Self-Aligned $TiSi_2$ and Deep-Trench Isolation Technologies, IEEE IEDM Tech Digest 522 (1983); S. Kohyama et al, Directions in CMOS Technology, IEEE IEDM Tech Digest 151 (1983); and K. Cham et al, Characterization and Modeling of the Trench Surface Inversion Problem for the Trench Isolated CMOS Technology, IEEE IEDM Tech Digest 23 (1983). These isolation trenches are formed in a manner similar to that described for the trench and corrugated cpacitors; namely, patterning (typically with oxide mask), RIE with $CBrF_3$, $CCl_4$, $Cl_2$—$H_2$, $CCl_4$—$O_2$, etc. excavation, thermal oxidation (plus LPCVD nitride) of the sidewalls, and filling with polysilicon.

However, the use of trench capacitors fails to fully solve the problems of shrinking dRAM cell size; namely, the cell still occupies a large substrate area for both the horisontally placed field effect transistor and a vertically placed trench capacitor.

SUMMARY OF THE INVENTION

The present invention provides a one-transistor dRAM cell structure and memory array in which the cell transistor and capacitor are formed on the sidewalls of a substrate trench at the intersection of a bit line and a word line. This yields a stacking of the cell transistor on top of the cell capacitor and consumes a minimal substrate area.

In preferred embodiments the cell capacitor plates are formed by the doped lower portion of the trench sidewalls and doped polysilicon filling the trench and extending out of the trench to the ground. The transistor gate is doped polysilicon in the upper portion of the trench; the transistor source is the trench sidewall capacitor plate, the drain is a substrate surface diffusion, and the channel is formed in the substrate. The trench may have a recessed upper portion to accommodate the transistor gate.

This stacked arrangement for the transistor and capacitor in a trench solves the problem of the known cell structures of occupying too much substrate area.

DESCRIPTION OF THE PREFERRED EMBODIMENTS

Figure 1A:
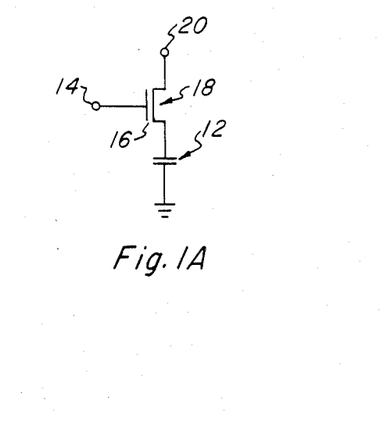
FIGS. 1A-B are the schematic equivalent circuit and local memory array geometry for preferred embodiment dRAM cells.

The preferred embodiment dRAM cells are one transistor/one capacitor cells connected to bit and word lines as shown in schematic FIG. 1A and operates as follows. Capacitor 12 stores charge to represent a bit of information (for example, no stored charge could represent a logic 0 and the stored charge corresponding to a potential of 5 volts across the capacitor plates could represent a logic 1). The bit of information is accessed (either to read the stored bit or to write a new bit) by applying a voltage on word line 14 connected to gate 16 to turn ON transistor 18; a turned ON transistor 18 connects capacitor 12 to bit line 20 for the read or write. Leakage currents and other sources of decay of the charge on capacitor 12 necessitate periodic refreshing of the charge, and thus the name dynamic RAM (dRAM).

Figure 1B:
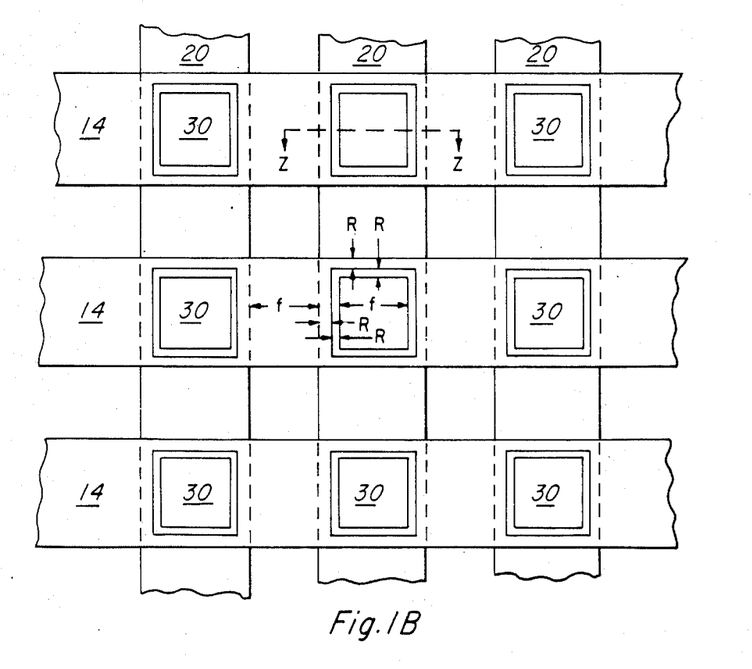

FIG. 1B is a plan view showing a portion of dRAM array of bit line 20 and word lines 14 with preferred embodiment cells 30 at the intersections of the lines; note that bit lines 20 pass under word lines 14. The cells extend down into the substrate below the intersecting lines and provide a maximal density memory array. It the minimum feature size is denoted by f and the minimum registration tolerance by R, then the cell area is $[2(f+2R)]^2$. For example, with a minimum feature size of 1.0 micron and a minimum registration tolerance of 0.125 micron, the cell area is about 6.25 square microns.

Figure 2A:
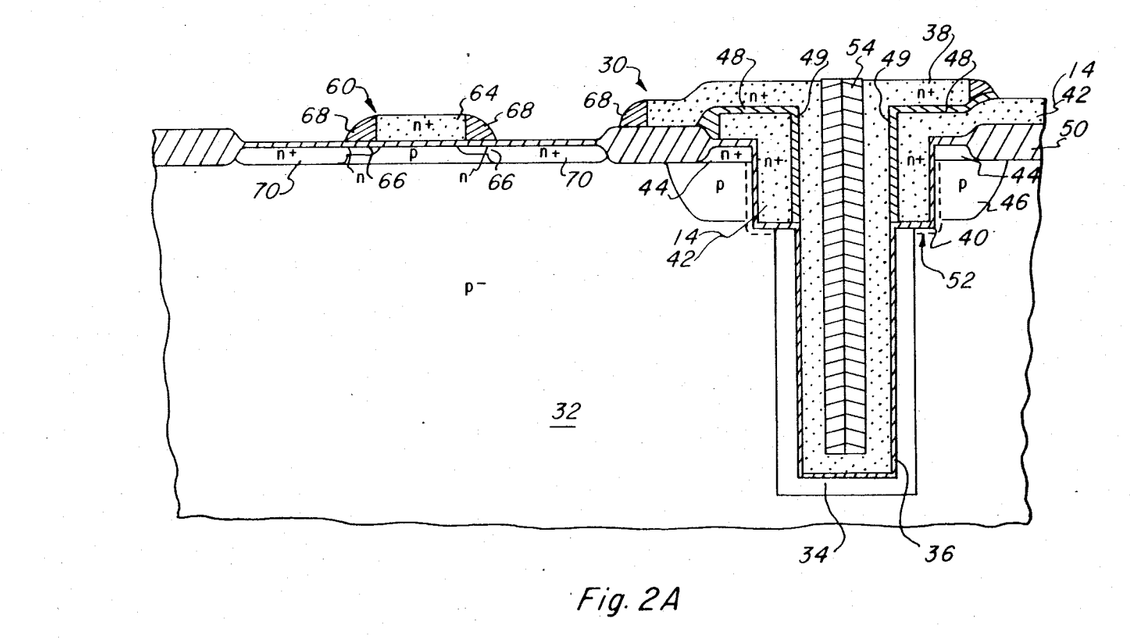
FIGS. 2A-B are cross sectional and plan views, respectively, of the first preferred embodiment cell.
Figure 2B:
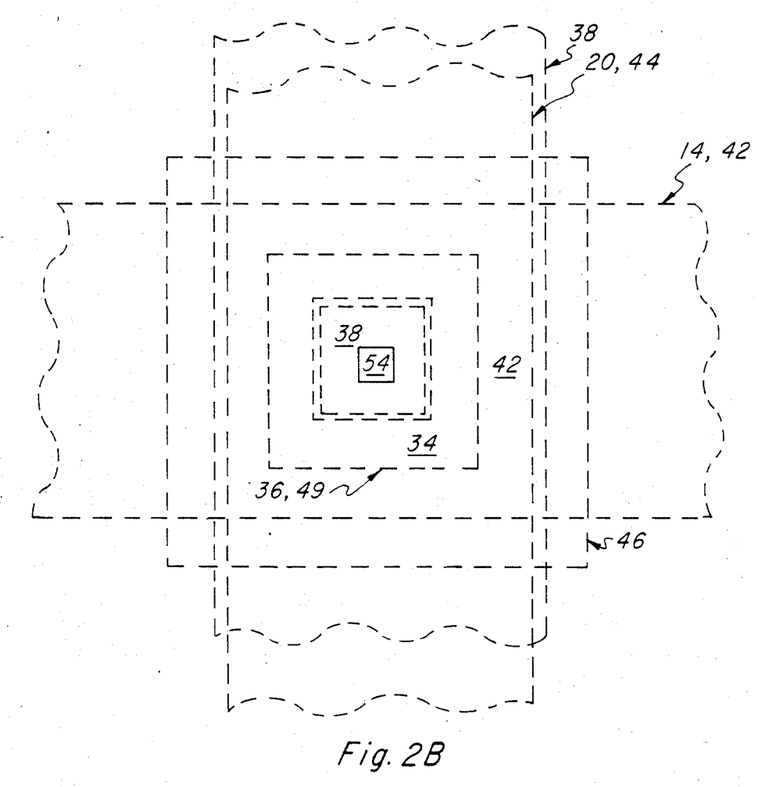

FIGS. 2A-B are cross sectional and plan views of a first preferred embodiment dRAM cell, generally denoted 30. Cell 30 is formed in p— silicon substrate 32 and includes n+ plate region 34, capacitor dielectric layer 36, n+ polysilicon plate layer 38, gate oxide layer 40, n+ polysilicon gate layer 42, n+ drain region 44, p region 46, insulating oxide layer 48, and field oxide 50. The capacitor of cell 30 is formed with the ground plate being layer 38, the dielectric is oxide/nitride/oxide layer 36, and the other plate is n+ region 34. Thus the capacitor plates and separating dielectric are the bottom and lower sidewall portions of a trench formed in substrate 32; note that with a positive voltage applied to the capacitor plate region 34, the junction between region 34 and substrate 32 is reversed biased. The transistor of cell 30 is formed with region 34 as the source, region 44 as the drain, polysilicon layer 42 as the gate, oxide layer 40 as the gate oxide, and region 52 (shown as dotted lines in FIG. 2A) of substrate 32 and region 46 as the channel. Thus, the transistor roughly has the shape of a square-cross-section cylinder oriented perpendicular to the plane of substrate 32; see FIG. 2B where the top view of gate oxide layer 40 illustrates the approximately square cross section of this cylinder. As shown in FIG. 2B word line 14 is formed in layer 42 and is perpendicular to bit line 20 formed in layer 44; a ground line is formed in layer 38 and parallels bit line 20. Bit line 20 and ground line 38 run perpendicular to the paper in FIG. 2A, whereas, word line 14 runs parallel to the paper. The view in FIG. 2A of cell 30 is along line 2—2 in FIG. 1B, note that the lefthand portion of FIG. 2A illustrates a peripheral transistor 60 and is not another cell.

The effective length of channel 52 is the thickness of p region 46 because the portion of channel 52 in substrate 32 is much more lightly doped than p region 46 and only acts as a drift region as in double diffused MOS; also, the doping density of region 46 may be adjusted in order to adjust the threshold voltage of the transistor. Note that polysilicon layer 38 may not completely fill the trench (depending on the thickness of layer 38 and the width of the trench) and the gap is filled with oxide 54. FIG. 2A also shows a field effect transistor 60 which can be fabricated simultaneously with cell 30 and may be used for the peripheral circuitry of a dRAM. Note that both transistors 18 in cell 30 and 60 in the periphery are formed in bulk substrate with polysilicon gates.

The dimensions and material characteristics of cell 30 are best understood in connection with the following description of a first preferred embodiment method of fabrication; cross sectional views are illustrated in FIGS. 3A-G.

Figure 3A:
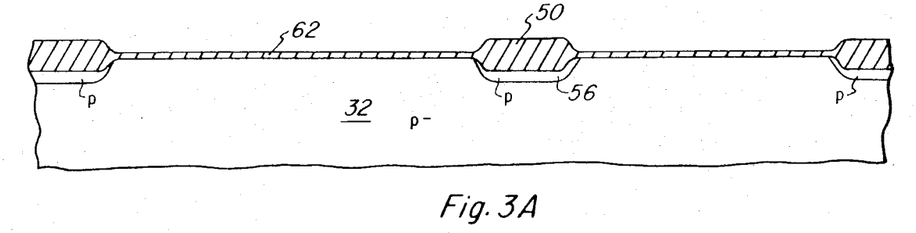
FIGS. 3A-G illustrate the sequence of fabrication steps for the first preferred embodiment cell by the first preferred embodiment method.
Figure 3B:
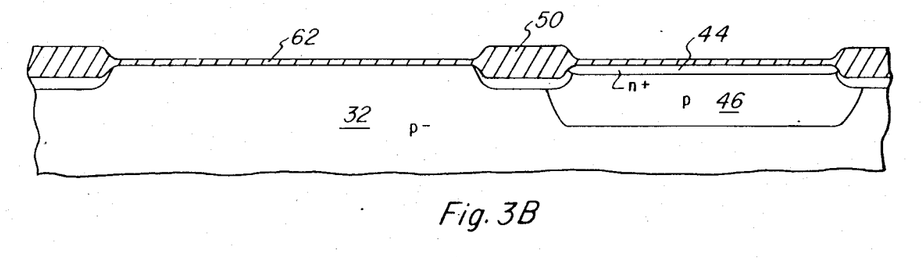
Figure 3C:
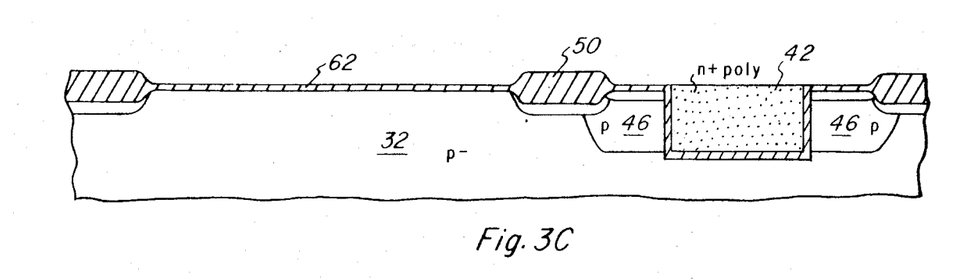
Figure 3D:
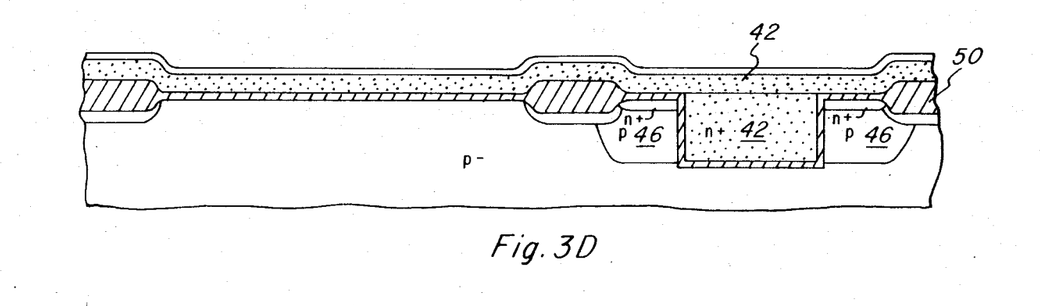
Figure 3E:
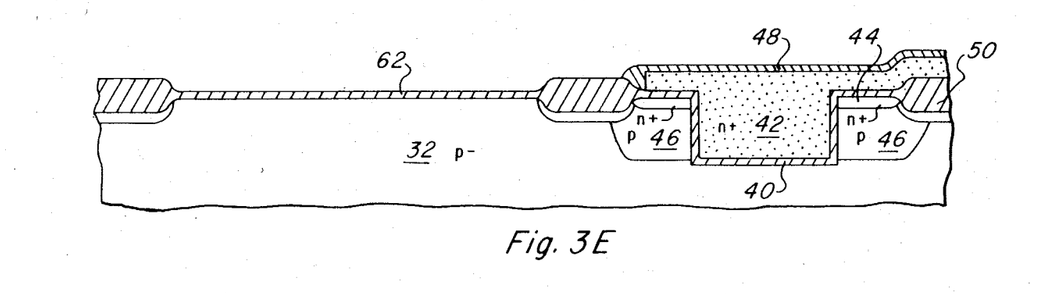
Figure 3F:
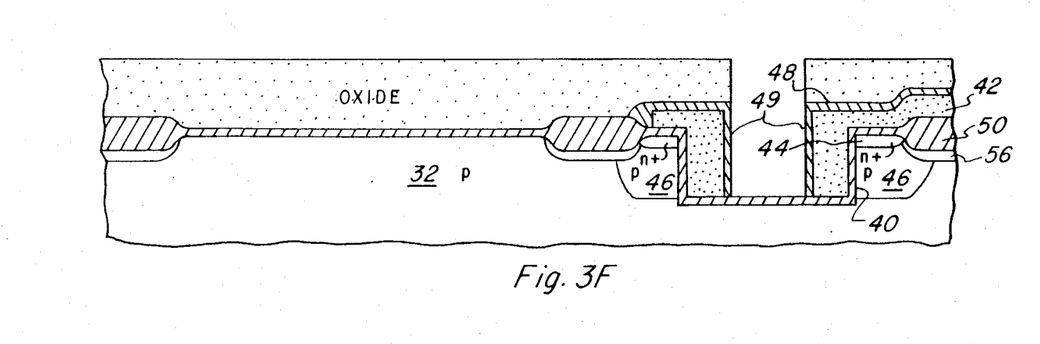
Figure 3G:
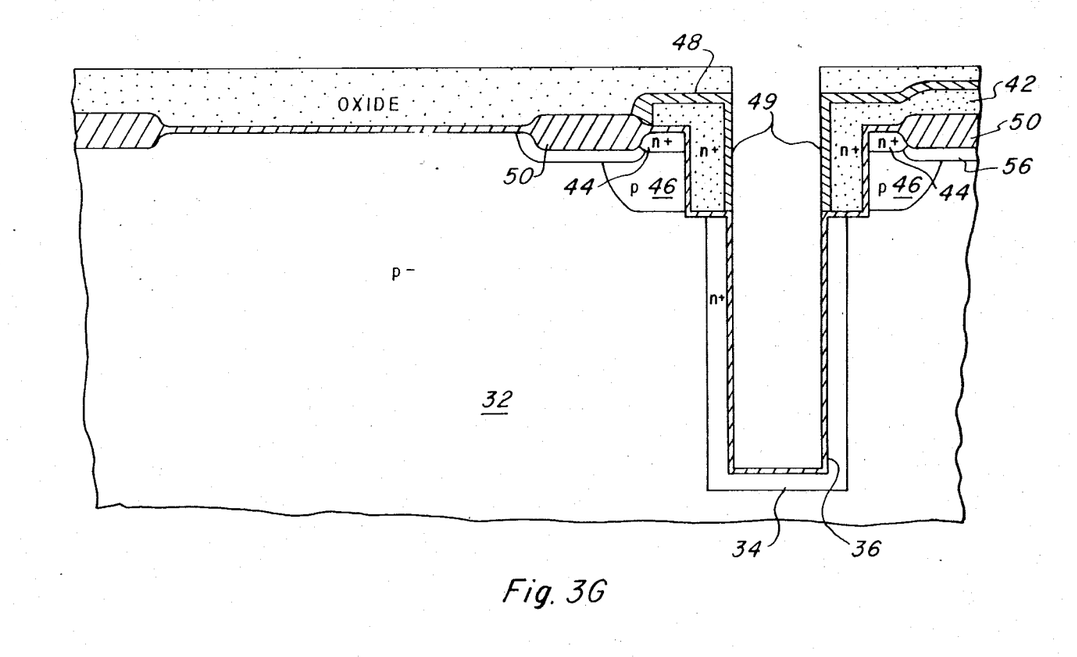

1. (100) oriented p— silicon substrate 32 with resistivity 5-10 ohm-cm has field oxide 50 with channel stops 56 formed in the usual manner: a stress relief oxide layer is grown and LPCVD nitride is deposited on the oxide;

the active area is patterned and plasma etching removes the nitride and oxide outside the active area; a boron implant using the nitride as a mask creates channel stops 56 to a depth of 4,000 A with a carrier concentration of 1E17 per cm$^3$; and field oxide 50 is grown to a thickness of 8,500 A. The nitride is stripped; see FIG. 3A.

2. The peripheral regions (lefthand portion of FIG. 3) are masked, and boron and arsenic implants create regions 44 and 46, respectivley. Region 46 is doped to about 1E17 carriers per cubic centimeter and is 1.5 micron thick; region 44 is doped to about 1E20 carriers per cubic centimeter and is about 3,500 A thick. Note that bit line 20 is formed in layer 44; see FIG. 3B.

3. A layer of CVD nitride is applied and is patterned to define transistor trenches, and the trenches are excavated by RIE using HCl to a depth of about 1.5 microns which is about the bottom of region 46. The trenches are about 2.5 microns square, and after excavation, the trench is cleaned of RIE damage and contamination by a wet acid etch, and a thermal oxide layer grown to form gate oxide layer 40. The RIE nitride mask is stripped. The transistor trench is then filled by a deposition of n+ doped LPCVD polysilicon 42 which is planarized in the usual manner of spinning on material such as photoresist and plasma etching the polysilicon-resist combination down to the oxides 50 and 62, see FIG. 3C.

4. A 3,000 A layer of additional n+ doped polysilicon 42 is deposited by LPCVD and a layer of oxide grown on it; see FIG. 3D.

5. The polysilicon layer deposited in step 4 is patterned to form word lines 14 and an insulating layer of oxide 48 grown; see FIG. 3E.

6. A 1.0 micron layer of CVD oxide is deposited and patterned to define the storage trenches about 1.5 microns square which are then excavated by RIE with HCl in two stages. First the storage trench is excavated down to oxide layer 40 at the bottom of the transistor trench; again the trench is cleaned and insulating oxide layer 48 is grown on the sidewalls; see FIG. 3F.

7. The second stage of excavation of the storage trench is again by RIE with HCl and extends the trench about 4.0 microns into substrate 32 beyond the bottom of the transistor trench. Again the trench is cleaned; next n+ layer 34 is formed on the walls and bottom of the trench by vapor phase diffusion, and the RIE mask oxide etched; and lastly, capacitor oxide/nitride/oxide stack dielectric 36 is formed to a thickness of about 150 A by thermal growth of oxide, LPCVD deposition of nitride, and oxidization of the nitride; see FIG. 3G.

8. N+ doped polysilicon layer 38 is deposited by LPCVD, this partially fills the storage trench, and is patterned to form the ground lines 38 overlying bit line 20 and drain region 44 (see FIG. 2B) and the gates 64 of peripheral field effect transistors 60. The n source and drain regions 66 of transistors 60 are then implanted using gate 64 as the mask. Lastly, a conformal LPCVD oxide deposition is made and then plasma etched to leave refill oxide 54 plus handles 68 on gate 64 and layer 38. Further arsenic implants to form n+ source and drain regions 70 of transistor 60 can now be made; see FIG. 2A.

Note that cell 30 has a capacitor area of about 26 square microns (the bottom is about 2.25 square microns and each of the four sidewalls is about 6 square microns) although the substrate area occupied by the cell is only about 16 square microns.

Figure 4:
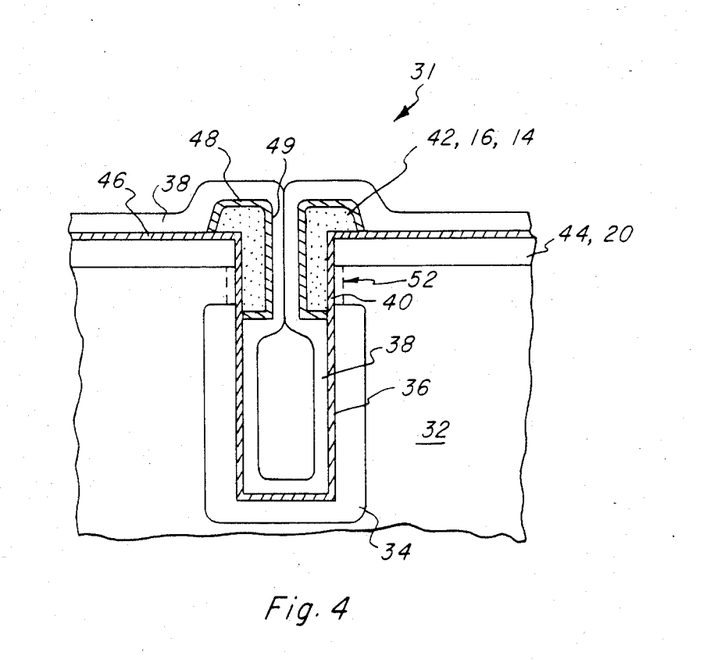
FIG. 4 is a cross sectional view of a second preferred embodiment cell.

Second preferred embodiment cell 31 is illustrated in cross sectional view in FIG. 4; the elements of cell 31 are given the same reference numerals as the corresponding elements of cell 30. Note that in FIG. 4 the bit line 20 and ground line 38 run parallel to the paper and word line 14 runs perpendicular; this is the reverse of FIG. 2A. Also, cell 31 has only a single trench instead of the two level trench of cell 30; this leads to gate 42 forming a neck in the trench and a consequent limit to the amount of polysilicon 38 that can deposit below the neck.

Modifications of the preferred embodiment cells or the preferred embodiment method of fabrication such as varying the dimensions, the shape of the trenches, doping levels, substitutional materials, diffusions in lieu of implantations, wet instead of dry etching, various halocarbons for RIE, and so forth are immediate.

I claim:

1. A memory cell comprising:
    a substrate having a first conductivity type, having a first cavity formed therein and having a second cavity formed therein contiguous with said first cavity and extending farther into said substrate than said first cavity;
    a first conductive region formed in said second cavity but insulated from said substrate;
    a first doped region of a second conductivity type formed in said substrate adjacent to said second cavity;
    a second doped region of said second conductivity type formed in said substrate adjacent to and surrounding the portion of said second cavity extending from said first cavity into said substrate, and adjacent to said first cavity but disposed away from said first doped region, defining a channel region in said substrate between said first and second doped regions; and
    a second conductive region formed in said first cavity but insulated from said substrate and insulated from said first conductive region.

2. A memory cell as in claim 1 wherein said first and second conductive regions comprise polycrystalline silicon.

3. A memory cell as in claim 1 wherein said first and second conductive regions are insulated from said substrate by a dielectric.

4. A memory cell as in claim 3 wherein said dielectric is chosen from the group of silicon dioxide and silicon nitride or a combination thereof.

5. A memory cell as in claim 1 wherein said substrate comprises crystalline silicon.

6. A memory array comprising:
    a substrate having a first conductivity type;
    a first group of substantially parallel conductive leads formed on the surface of said substrate;
    a second group of substantially parallel conductive leads formed on the surface of said substrate defining crosspoints with the intersections with said first group of conductive leads;
    a memory cell formed at a plurality of said crosspoints in a first cavity formed therein and having a second cavity formed therein contiguous with said first cavity and extending farther into said substrate than said first cavity, each of said memory cells comprising:
        (a) a first conductive region formed in said second cavity but insulated from said substrate;

(b) a first doped region of a second conductivity type formed in said substrate adjacent to said second cavity;

(c) a second doped region of said second conductivity type formed in said substrate adjacent to said first cavity but disposed away from said first doped region, defining a channel region in said substrate between said first and second doped regions; and (d) a second conductive region formed in said first cavity but insulated form said substrate and insulated from said first conductive region.

7. A memory array as in claim 6 wherein said first and second conductive regions comprise polycrystalline silicon.

8. A memory array as in claim 6 wherein said first and second conductive regions are insulated from said substrate by a dielectric.

9. A memory array as in claim 8 wherein said dielectric is chosen from the group of silicon dioxide and silicon nitride or a combination thereof.

10. A memory array as in claim 6 wherein said substrate comprises crystalline silicon.

* * * * *